United States Patent [19]
Shimura et al.

[11] Patent Number: 5,271,890
[45] Date of Patent: Dec. 21, 1993

[54] METHOD FOR PRODUCING CARBON ALLOTROPE

[75] Inventors: Hirofumi Shimura; Shinya Sasaki; Yuji Enomoto, all of Tsukuba, Japan

[73] Assignee: Agency of Industrial Science & Technology, Ministry of International Trade & Industry, Tokyo, Japan

[21] Appl. No.: 969,360

[22] Filed: Oct. 30, 1992

[30] Foreign Application Priority Data

Nov. 1, 1991 [JP] Japan .................. 3-315378

[51] Int. Cl.⁵ .................................... B22F 7/04
[52] U.S. Cl. ................................ 419/11; 419/5; 419/8; 419/9; 148/565; 148/902; 156/168; 204/157.47; 427/249; 427/596
[58] Field of Search .............. 419/5, 8, 9, 10, 11, 419/25, 45; 427/249, 596; 156/DIG. 68; 204/157.47; 148/565, 902

[56] References Cited

U.S. PATENT DOCUMENTS

| | | |
|---|---|---|
| 4,248,909 | 2/1981 | Whittaker ............... 427/162 |
| 4,537,791 | 8/1985 | Tarjan ....................... 427/2 |
| 4,758,404 | 7/1988 | Muto ......................... 419/3 |
| 5,098,737 | 3/1992 | Collins et al. ........... 427/53.1 |
| 5,114,447 | 5/1992 | Mort et al. ............... 106/20 |
| 5,154,945 | 10/1992 | Baldwin et al. ......... 427/596 |
| 5,178,980 | 1/1993 | Mort et al. ............... 430/58 |

Primary Examiner—Donald P. Walsh
Assistant Examiner—Chrisman D. Carroll
Attorney, Agent, or Firm—Oblon, Spivak, McClelland, Maier & Neustadt

[57] ABSTRACT

A coating film of a carbon allotrope is formed on a substrate by continuously supplying a fine carbon powder onto the substrate and simultaneously irradiating the fine carbon powder with a laser beam of a high output level thereby inducing sublimation of the fine carbon powder, and quenching the sublimated fine carbon powder to cause deposition thereof on the substrate.

4 Claims, 2 Drawing Sheets

100μm

METHOD FOR PRODUCING CARBON ALLOTROPE

BACKGROUND OF THE INVENTION

1. Field of the Invention

This invention relates to a method for the production of a carbon allotrope know as a fullerene.

2. Prior Art Statement

Recently, new carbon allotropes whose steric structures are formed by the aggregation of about 30-500 carbon atoms have been discovered and given the name "fullerenes". At present, studies are being devoted to developing combinations of these carbon allotropes with various substances and utilizing such combinations in various technical fields related to superconducting materials, optical switching elements, and pharmaceutical products.

Fullerenes have heretofore been produced by a procedure which comprises irradiating carbon with a laser beam or plasma of a high energy density and blowing out the vaporized carbon with an inert gas such as helium, or by the CVD technique.

These methods, however, produce only a fullerene powder or an extremely thin fullerene coating film which is low in adhesiveness. The substances obtained by these methods are therefore difficult to utilize effectively and their physical properties are hard to evaluate.

An object of this invention is to provide a method for producing a relatively thick coating film of carbon allotrope excelling in adhesiveness.

SUMMARY OF THE INVENTION

To accomplish this object, the method for the production of carbon allotrope contemplated by this invention comprises continuously supplying fine carbon powder onto a substrate, irradiating the fine carbon powder with a laser beam of a high output level thereby inducing sublimation of the fine carbon powder, and quenching the sublimated fine carbon powder to cause deposition of the product of the quenching on the substrate.

Thus, in the present invention, the fine carbon powder is instantaneously sublimated by exposure to the laser beam of a high output level and the sublimated fine carbon powder is deposited in the form of carbon allotrope on the substrate when the irradiation of the fine carbon powder with the laser beam is discontinued and the fine carbon powder is consequently quenched. The method of this invention permits the deposited allotrope to form a coating film of a relatively large thickness on the order of 100 $\mu$m when the amount of the fine carbon powder supplied and the duration of the exposure of the fine carbon powder to the laser beam are properly adjusted. This coating film exhibits fast adhesiveness to the substrate.

The other objects and characteristic features of this invention will become apparent from the detailed description to be made below with reference to the annexed drawings.

DESCRIPTION OF THE PREFERRED EMBODIMENTS

The present inventors conducted a study with a view to producing a relatively thick coating film or bulky article of carbon allotrope and consequently have found that this production can be realized by effective use of a laser beam of a high output level.

Figure 1:
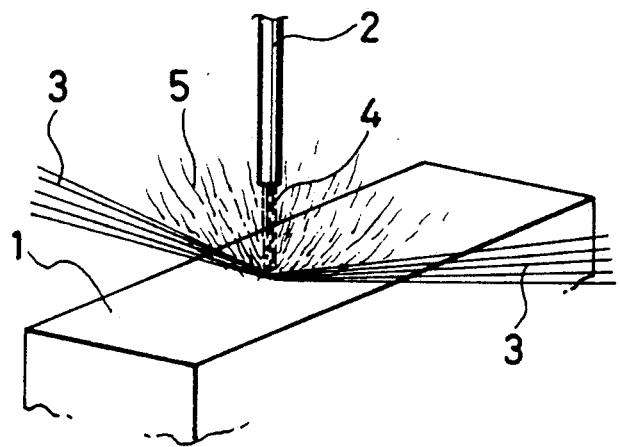
FIG. 1 is a schematic explanatory diagram illustrating the method for the production of carbon allotrope contemplated by this invention.

This invention is based on the finding mentioned above. Now, this invention will be described specifically below with reference to FIG. 1. The method of this invention produces a carbon allotrope coating film on a substrate by supplying fine carbon powder 4 by means of a nozzle 2, for example, to a prescribed position on a substrate 1, sublimating the fine carbon powder on the substrate 1 by exposure thereof to a laser beam 3 of a high output level, and then quenching the sublimated fine carbon powder 5 thereby enabling the quenched fine carbon powder to be deposited in the form of carbon allotrope on the substrate 1.

As the fine carbon powder 4 to be supplied onto the substrate 1, fine carbon powder of the ordinary run (having particle diameters on the order of 5 to 0.1 $\mu$m), ultrafine carbon powder (obtained by the plasma process or arc process and having particle diameters on the order of 300 to 0.5 nm), and atomic carbon are usable. The smaller the particle diameter of the carbon powder is, the more appropriate the carbon powder is for use in this invention.

The fine carbon powder 4 is carried with an inert gas such as argon or nitrogen, supplied through the nozzle 2, and accumulated at the prescribed position on the substrate 1 (gas deposition). At the same time, the fine carbon powder thus deposited on the substrate 1 is exposed to the laser beam 3 of a high output level in the range of 3 to 5 kw.

The substrate 1 is required to be formed of a material such that the material itself is capable of reacting with carbon and that the substrate made of this material, on contact with the fine carbon powder sublimated by sudden heating with the laser beam of the high output level, is capable of quenching the sublimated fine carbon powder. Concrete examples of materials that answer this description are iron and nickel.

When the substrate is made of iron, the laser beam to be used for the sublimation of the fine carbon powder is desired to be diagonally projected onto the substrate at an angle not larger than the critical angle. In this case, since iron has a large refractive index, the laser beam projected at an angle not larger than the critical angle is wholly reflected by the surface of the substrate. When the fine carbon powder is blown against the point of impingement of the laser beam while the incident laser beam is being wholly reflected by the surface of the substrate, the carbon, on instantaneously absorbing the laser beam owing to the change in the refractive index, is sublimated and then deposited around the point of laser beam impingement on the substrate. At this time, the carbon is quenched by the iron substrate and the carbon allotrope consequently formed accumulates in the form of a transparent film. This carbon allotrope is easily made to form a coating film about 30 $\mu$m in thickness by suitably selecting the particle diameter of the fine carbon powder, the rate of supply of the raw material, the intensity of the laser beam, the duration of the exposure to the laser beam, etc.

The fact that the coating film of carbon allotrope is obtained as described above indicates that when the fine carbon powder being blown against the substrate is simultaneously scanned with the laser beam, the coating film can be produced continuously along the path of the scanning.

Since the fullerenes can be produced in the bulky form of a coating film instead of the form of powder by the method of this invention, the fullerenes can be accurately tested for such physical properties as hardness and electric resistance, for example. Moreover, the conventional method mentioned above generally encounters difficulty in producing pure Cx (wherein x stands for a number generally in the range between 60 and 84) and normally produces a mixture of allotropes of varying values of x. The method of this invention is capable of producing a carbon allotrope having a substantially constant value of x.

By mixing the fine carbon powder with another element similar morphologically to carbon and supplying the resultant mixture onto the substrate and simultaneously irradiating it with the laser beam, there can be formed a coating film of carbon allotrope which is combined with the added element and imparted with a new function.

Now, a working example of this invention will be described.

A fine carbon powder having a particle diameter of 100 nm carried on He gas was blown onto an iron substrate at the rate of 0.01 g/minute and a carbon gas laser beam of 4 kw was projected at an angle of 10° onto the site of impingement of the fine carbon powder. The spot of irradiation with the laser beam was 2 mm in diameter and the duration of this irradiation was 10 seconds. The fine carbon powder was sublimated as soon as it was irradiated with the laser beam and the sublimated carbon was quickly deposited at positions 2.5 mm away from the point of impingement of the laser beam. Consequently, a clear coating film measuring about 600 $\mu$m in diameter and about 60 $\mu$m in thickness was formed.

Figure 2:
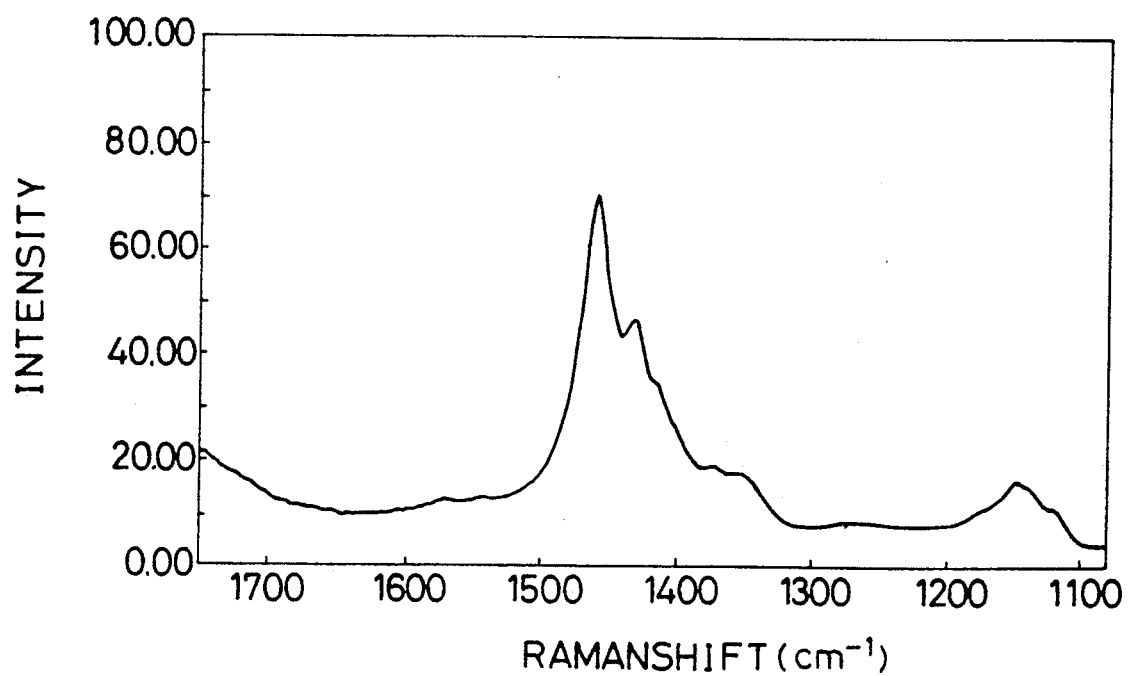
FIG. 2 is a diagram of the Raman spectrum obtained of a carbon allotrope coating film produced by the method of this invention.

The coating film thus obtained, when scattered by the Raman process, produced the Raman spectrum shown in FIG. 2. In this Raman spectrum, the spectroscopic characteristics of the coating film were found to coincide with those of $C_{60}$, indicating that the coating film was formed of $C_{60}$.

The coating film, when analyzed by the TOF-SIMS (Time of Flight Secondary Ion Micro-Scope) method, was found to be formed substantially wholly of $C_{60}$.

Figure 3:
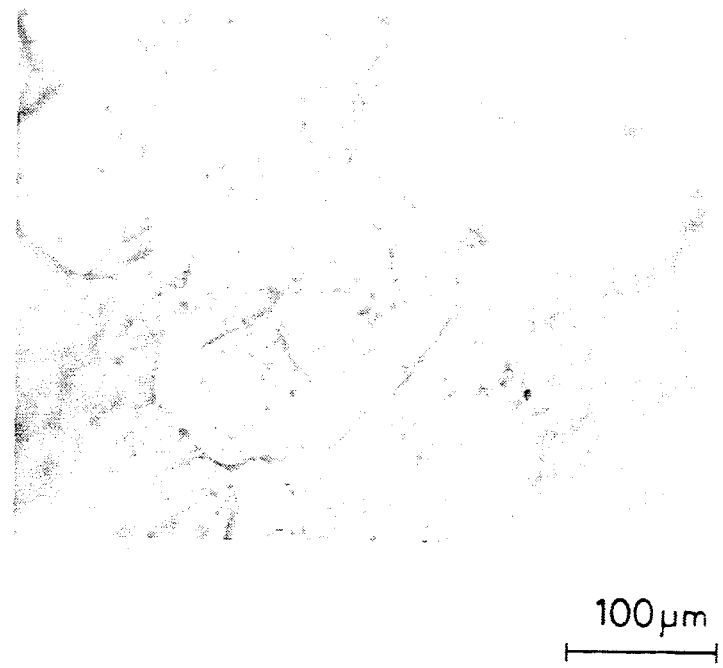
FIG. 3 is a photomicrograph of the carbon allotrope coating film produced by the method of this invention.

FIG. 3 is a photomicrograph showing the texture of the coating film at 200 magnifications. The black rectangular point in this photograph is a mark left by the impression of a Vickers pressure bit. No crack can be observed around this point.

As is clear from the description given above, the method of this invention enables a relatively thick coating film or bulky article of fullerenes such as has not been obtainable by any of the conventional methods to be easily produced owing to effective use of the laser beam of a high output level. Moreover, it produces Cx of relatively high purity, allows positive incorporation of other element in the allotrope easily, and finds effective utilization in the development of novel functional materials.

What is claimed is:

1. A method for the production of a carbon allotrope, which comprises supplying a fine carbon powder onto a substrate, irradiating said fine carbon powder on said substrate with a laser beam of a high output level thereby sublimating said fine carbon powder, and quenching the sublimated fine carbon powder, thereby effecting deposition of said carbon powder on said substrate.

2. A method according to claim 1, wherein said laser beam of a high output level has an output level in the range between 3 and 5 kw.

3. A method according to claim 1, wherein said substrate is made of iron.

4. A method according to claim 1, wherein the angle of projection of said laser beam of a high output level is not more than the critical angle.

* * * * *